United States Patent [19]

Chisholm et al.

[11] Patent Number: 4,518,085
[45] Date of Patent: May 21, 1985

[54] MULTI-PURPOSE TRANSPORT TRAY

[75] Inventors: William M. Chisholm, Midlothian; Fred E. Thompson, Quinton, both of Va.

[73] Assignee: AT&T Technologies, Inc., New York, N.Y.

[21] Appl. No.: 537,542

[22] Filed: Sep. 30, 1983

Related U.S. Application Data

[63] Continuation of Ser. No. 373,191, Apr. 29, 1982, abandoned.

[51] Int. Cl.³ .......................... B65D 1/38; B65D 21/00
[52] U.S. Cl. .................................. 206/454; 206/511; 206/558; 211/41; 361/415
[58] Field of Search ............... 206/455, 456, 509, 507, 206/503, 505, 558, 564, 303, 309, 444, 445, 511, 512, 587, 589, 328, 454, 557, 565, 334, 561; 211/41, 126, 133; 312/111; 432/253, 261, 258; 198/339, 472; 361/415

[56] References Cited

U.S. PATENT DOCUMENTS

| D. 260,237 | 8/1981 | Fuzere | 206/334 X |
|---|---|---|---|
| 928,762 | 7/1909 | Insinger | 211/41 |
| 1,621,327 | 3/1927 | Lehman | 211/41 |
| 3,014,594 | 12/1961 | Kerstner | 211/41 |
| 3,016,148 | 1/1962 | Riddle | 211/41 |
| 3,396,867 | 8/1968 | Garriga | 206/511 |
| 3,534,862 | 10/1970 | Shambelan | 211/41 |
| 3,877,134 | 4/1975 | Shanahan | 211/41 |
| 3,915,307 | 10/1975 | Agarde | 211/41 |
| 3,923,156 | 12/1975 | Wallestad | 206/564 X |
| 3,926,305 | 12/1975 | Wallestad | 206/334 X |
| 3,949,891 | 4/1976 | Butler et al. | 211/41 |
| 4,023,691 | 5/1977 | Perel | 206/564 X |
| 4,171,740 | 10/1979 | Clement et al. | 206/213.1 |
| 4,256,229 | 3/1981 | Lee | 211/41 |
| 4,308,954 | 1/1982 | Wilson | 206/505 |
| 4,334,616 | 6/1982 | Wilson | 206/505 |
| 4,398,628 | 8/1983 | Chisholm | 198/339 |

Primary Examiner—Allan N. Shoap
Assistant Examiner—Bryon Gehman
Attorney, Agent, or Firm—W. G. Dossé; G. W. Houseweart; S. I. Rosen

[57] ABSTRACT

An article of manufacture having specific utility as a multi-purpose, stackable transport tray for printed-wiring boards and accessories therefor in reusable carrier shuttles and comprising an open-work base with side portions extending upward from the base. A shelf runs the inside length of each side portion with a plurality of fin-shaped support members spaced away from the shelf by an arbitrary amount and extending inwardly from the side portion. A plurality of stiffening members extend from the base to the shelf. A plurality of ribs on the bottom surface of the base extend in a direction parallel with the sides and positioned so as to interlock and engage the support members of an underlying tray. A plurality of transverse ribs on the bottom of the base are also so positioned to engage the support members of an underlying tray.

4 Claims, 5 Drawing Figures

MULTI-PURPOSE TRANSPORT TRAY

This is a continuation of application Ser. No. 373,191, filed Apr. 29, 1982, now abandoned.

TECHNICAL FIELD

The present invention relates to carrying trays and more particularly to a tray for carrying and protecting one type of object and at other times for carrying and protecting another type of object.

BACKGROUND OF THE INVENTION

In the manufacture of pin-populated, rigid printed wiring boards (also referred to as a backplane), the boards must often be transported from place to place in their finished form with pins projecting from both surfaces of the board. Unless the support for the boards is sufficient to shield both ends of the pins from inadvertent contact with other objects, the pins may well be bent or otherwise deformed. This may be costly to rectify and may actually cause a board to be scrapped.

In the manufacture of such pin-populated, rigid boards, the pins must be inserted in the board in predetermined, and possibly quite extensive patterns. It is very easy for errors to occur in these patterns. Errors can be impossible or at least costly and time-consuming to repair; and repair may require a higher level of skills that the original assembly. A reusable shuttle of the type disclosed in U.S. patent application Ser. No. 326,103 filed on Nov. 30, 1981 (which is a continuation-in-part of Ser. No. 192,271 filed on Sept. 30, 1980) can carry pins arranged to populate a tranverse row on a board. As a row of pins is to be mounted in the board, the shuttle holding that row of pins is taken up, and the pins are transferred into a pin-insertion head for subsequent pressing into preexisting holes in the board. A large number of these shuttles with pins appropriately loaded therein must be arranged in a particular order so as to avoid errors in mounting the pins in the rigid board.

A carrier is needed to carry these pin-supporting shuttles in such a way that the pins are protected from injury and are kept in their desired arrangement from the time the shuttles are first loaded with pins until the pins are transferred into the pin-insertion head.

Consequently, there is a need for a tray which can efficiently carry and protect either the loaded shuttles or the rigid boards with pins mounted therein.

SUMMARY OF THE INVENTION

In accordance with the present invention, a multi-purpose transport tray comprises a base having edges, a first surface, and a second surface; two side portions, each having sides and extending from the first surface of the base and at the opposite edges of the base; a shelf running the length of each side portion and on the side thereof closest to the opposite side portion; and a plurality of fin-shaped support members projecting from each side portion generally toward the other side portion, each support member spaced away from the shelf by an arbitrary amount.

DETAILED DESCRIPTION

Figure 1:
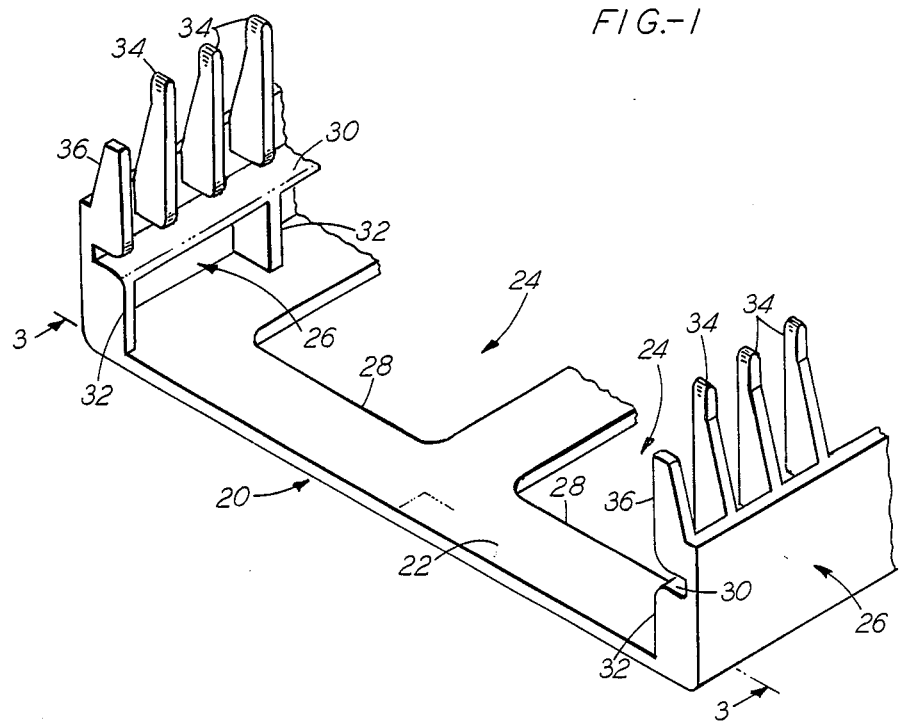
FIG. 1 is a fragmentary perspective view showing one end of the tray of the present invention, as viewed from the top.

Referring now to the accompanying drawings and more particularly FIG. 1, there is shown in fragmentary form one end of a multi-purpose, stackable transport tray arranged for holding and protecting pins that are secured within a pin-supporting shuttle in one mode and in another mode for protecting the wire pins after insertion in a printed wiring board. The tray is molded plastic such as styrene and comprises a base 20 with an upper surface 22. There are large opened areas 24 in the base where material is not needed. Two side portions 26 extend upwardly from the upper surface 22 along the longitudinal edges of the base 20. Each side portion 26 has an inside side closest to the other side portion 26, an outside side farthest from the other side portion, and two ends.

The tray can be manufactured as long as needed between the ends thereof, within reason, to accommodate the number of shuttles and the length of rigid printed wiring board desired. The ends of the tray and those portions of the tray nearest the end are indictative of the entire tray between the ends. Transverse portions 28 of the base 20 are provided at both ends of the tray. Other transverse portions can be provided at convenient locations along the length of the tray, closing the open areas 24 and stiffening the tray.

Figure 3:
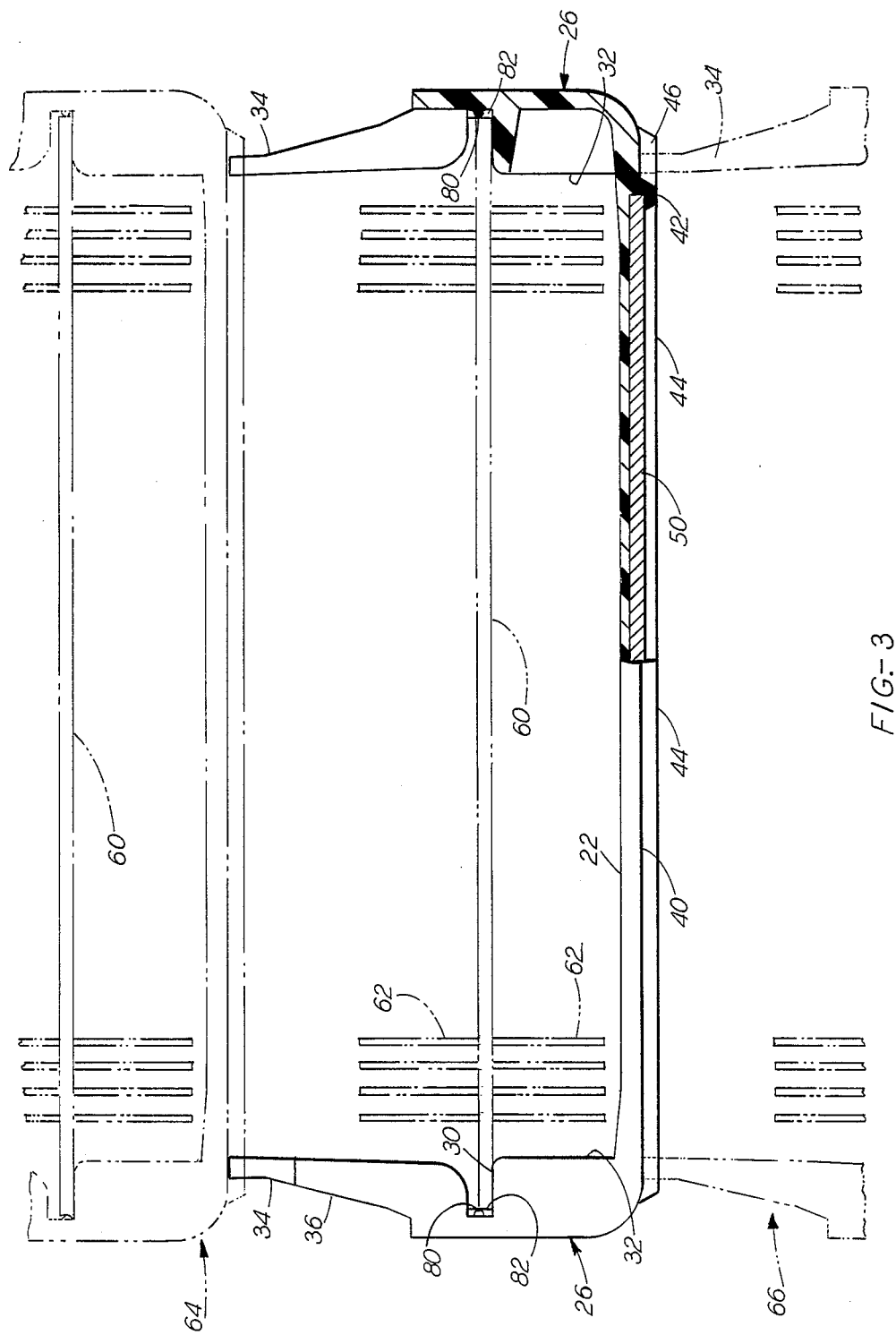
FIG. 3 is an end view of the tray, with the right half of the tray shown partially in cross section as indicated by the line 3—3 in FIG. 1.

Referring now simultaneously to FIGS. 1 and 3, the ends of the tray are essentially open, but the two side portions 26 extend upward from the base at each of the two longitudinal edges thereof. A shelf 30 extends the full length of each side portion on the inside thereof an arbitrarily distance above the upper surface 22 of the base 20. This distance is related to the height or depth to which pins project from a rigid printed wiring board or from a shuttle.

A plurality of fin-shaped stiffening members 32 extend all the way from the shelf 30 to the upper surface 22 of the base 20 and are in contact with the inside surfaces of the side portions 26. These stiffening members 32 are located at convenient intervals along the length of the tray as needed to prevent excessive flexure and angular displacement between the side portions 26 and the base 20.

The side portions 26 carry a plurality of fin-shaped support members 34 projecting inwardly from each side portion and spaced away from the shelf 30 by an arbitrary amount at least sufficient to clear the thickness of the printed wiring board to be carried in the tray. The fin-shaped support members 34 project inwardly from the side portions an amount sufficient to capture and retain the shuttles. The support members 34 extend upwardly from the shelf 30 to a location beyond the shuttles and beyond any pins in the printed wiring board. The end-most support members 36 at each end of the tray are shorter than all the other support members 34, as a convenience in order to facilitate extracting trays from the mold after the molding operation has been completed.

Figure 2:
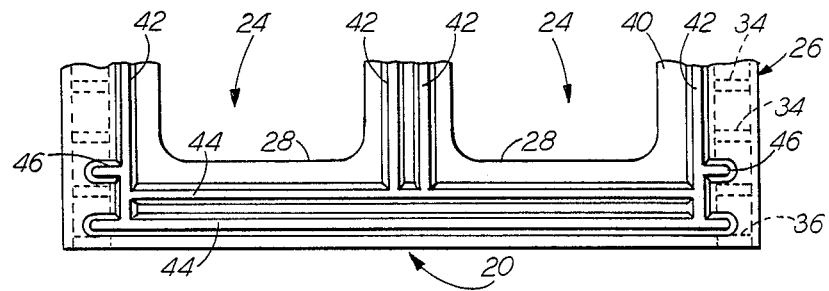
FIG. 2 is a fragementary bottom view of one end of the tray.

Referring now to FIG. 2 which shows the bottom of one end of the tray, the lower surface 40 of the tray has a plurality of longitudinal protrusions or ribs 42 extending nearly from one end of the tray to the other. The distance between the two outer-most longitudinal ribs is related to the distance between the support members 34 as indicated in connection with FIG. 3. A plurality of transverse ribs 44 are arranged to intersect the longitudinal ribs 42 at right angles and include a stub rib 46 near each corner of the lower surface of the tray and so located as to cooperate with the end-most full-length support member 34 of an underlying tray, as indicated more clearly with FIG. 4.

FIG. 3 is an end view of the tray shown partially in cross section and shows a cold-rolled steel stiffening member 50 which is molded into each end of the base 20 of the tray and located between and oriented parallel with the transverse ribs 44 of the tray. The steel stiffening members 50 serve to limit bending of the base 20 in either a straight flexure mode or a torsional mode, without the need for excessive molded material.

The steel stiffening members are manually inserted into the mold cavity at the start of each tray-molding operation. The steel stiffening members must be retained in the mold during the molding operation so that they are not dislodged by the molding material as it flows through the closed mold. This can best be accomplished by some form of mold protrusion or slide that presses the steel stiffening member inserts into a mold recess or onto a mold pin or slide that may project through holes (not shown) near the ends of the steel inserts.

A pin-populated printed wiring board 60 is shown in phantom in FIG. 3. The board 60 is shown resting on the two shelves 30 with its population of pins 62 extending downwardly and upwardly from the board 60. FIG. 3 shows that the base 20 protects the pins 62 extending downwardly from the printed wiring board 60 and the support members 34 extend upwardly far enough from the shelves 30 to extend well beyond the tops of the pins 62 that project upwardly from the board 60, thereby protecting the pins 62 when an overlying tray 64 (partially shown in phantom) is placed on top of the tray.

It can be seen from FIG. 3 that the lower surface 40 of the tray rests on the tops of the full-length support members 34 of an underlying tray 66 (partially shown in phantom). The support members 34 of the underlying tray 66 are positioned immediately outside of the longitudinal ribs 42 of the tray, thereby preventing relative lateral motion between the tray and the underlying tray 66 on which the tray is stacked.

In molding large structures such as the present tray, especially molded of materials such as styrene having a high coefficient of thermal expansion, it is sometimes difficult to design the initial mold to achieve exactly the desired large scale dimensions on the finished molded product. Reference is particularly made to the distance between the side portions 26. It is most desirable to design the mold for such a tray to assure that there will be enough separation between the side portions 26 in the area above the shelf 30 and below the bottoms of the support members 34 to allow inserting the board 60 without interference. However, this can result in a excessive width between side members, should the initial calculations for mold size be too generous. To adjust such differences involves making depressions in the mold with result in projections in the molded part. One example is the hemisphere-shaped projections 80 which extend inwardly from the side portions 26 in the region between the shelf 30 and the support members 34. The projections 80 serve to locate the board 60 and accommodate any excessively generous width of the tray. Alternatively, curved half-cylinder projections 82 can be formed on the side members preferrably between the shelf 30 and a support member 34 and in line therewith. These half-cylinder projections 82 might also impart an additional benefit of adding a slight amount of stiffening to the side portion 26.

Figure 4:
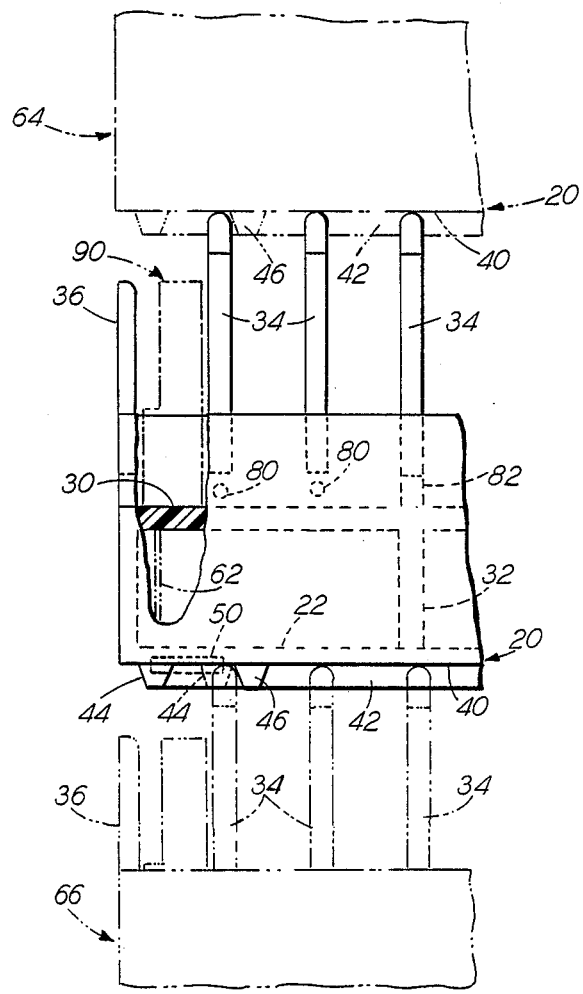
FIG. 4 is a fragmentary side view of one end of the tray shown partly broken away to indicate a shuttle in place.
Figure 5:
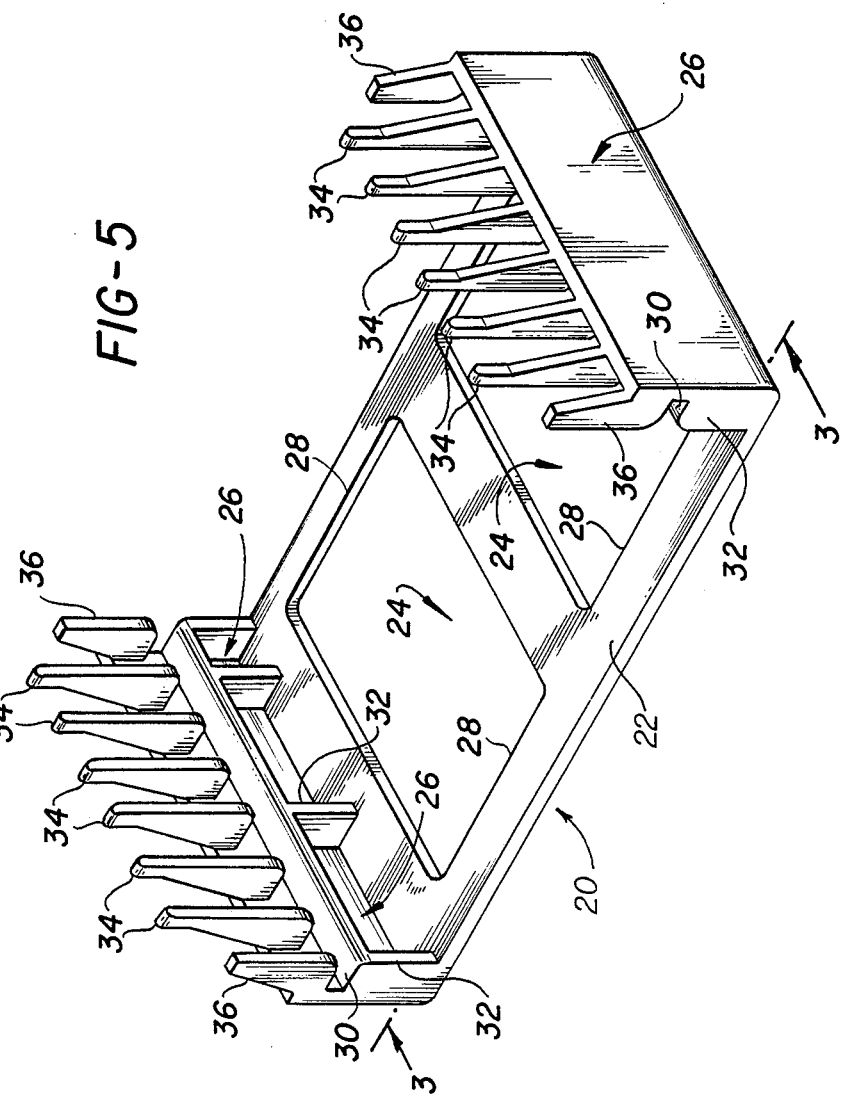
FIG. 5 is an overall view of a complete tray, which is shown shorter than a preferred embodiment of the present invention but which has two ends connected to each other.

Referring now to FIG. 4, a side view of one end of the present tray shows a phantom representation of a shuttle 90 in place in the tray with the pins 62 extending down from the shuttle 90. This illustrates the protection of the pins between the level of the shelf 30 and the upper surface 22 of the base 20. When the shuttle 90 is placed in the tray with the pins 62 pointed in a downwardly direction, the ends of the shuttle rest on the shelves 30. The shuttles 90 are prevented from longitudinal motion or twisting within the tray by the support members 34 which extend toward the opposite side member 26 by sufficient lengths to capture the shuttle 90.

The support members 34 are shown to extend upwardly to engage the lower surface 40 of the base 20 of the overlying tray 64 (shown in phantom). Relative longitudinal motion between the tray and the overlying tray 64 is prevented by the cooperation of the stub ribs 46 with the end-most full-length support members 34 which are arranged so that the stub ribs 46 are just adjacent to and inside of the first full-length support members 34.

It can be seem that the present support tray can carry a plurality of pin-loaded shuttles 90 with complete protection of the pins. Alternatively, the tray can carry the pin-populated boards 60 with the pins 62 extending on either side of the board. The trays are also arranged so that they can be stacked with their ribs 46 and 42 interlocking with the support members 34 of an underlying tray to prevent relative movement of the stacked trays.

What is claimed is:

1. A multi-purpose, stackable transport tray comprising:
   a base having edges, a first surface and a second surface;
   two side portions having sides and extending from the first surface of the base at opposite edges of the base
   a shelf running the length of each side portion projecting from the inside of each side portion toward the opposite side portion and located on the side of said side portion closest to the opposite side portion;
   a plurality of first stiffening members extending from the shelf to the base and extending generally in a plane oriented substantially perpendicular to the side portions and the base;
   a plurality of fin-shaped support members projecting from each side portion generally toward the other side portion and extending generally in a plane oriented substantially perpendicular to the side portions and the base, each support member spaced away from the shelf by an arbitrary amount, the shelves and said support members cooperating to define a plurality of compartments for supporting similarly-shaped articles in substantially parallel relationship;

a plurality of first ribs on the second surface of the base, extending in a direction parallel with the side portions, said ribs being positioned so as to interlock and engage the support members of an underlying tray;

a plurality of second ribs on the second surface of the base, extending perpendicular to the first ribs and so positioned to engage the support members of an underlying tray; and the tops of the support members arranged to project adjacent the first and second ribs of a similar, overlying tray so as to prevent relative motion of the tray in either of two dimensions with respect to an overlying tray when an overlying tray is stacked on top of the tray, with or without articles within said compartments.

2. A multi-purpose, transport tray comprising;

a base having edges a first surface and a second surface;

two side portions having sides and extending from the first surface of the base at opposite edges of the base;

a shelf running the length of each side portion projecting from the inside of each side portion toward the opposite side portion and located on the side of said side portion cloest to the opposite side portion;

a plurality of fin-shaped support members projecting from each side portion generally in a plane oriented substantially perpendicular to the side portions and the base, each support member spaced away from the shelf by an arbitrary amount, the shelves and said support members cooperating to define a plurality of compartments for supporting similarly-shaped articles in substantially parallel relationship;

a plurality of first ribs on the second surface of the base extending in a direction parallel with the side portions, said ribs being positioned to interlock and engage the support members of an underlying tray; and a plurality of second ribs on the second surface of the base, extending perpendicular to the first ribs and so positioned to interlock and engage the support members of an underlying tray, with or without articles within said compartments.

3. A multi-purpose transport tray according to claim 2 wherein the tops of the support members are arranged to project adjacent the first and second ribs of a similar, overlying tray so as to prevent relative motion of the tray in either of two dimensions with respect to an overlying tray when an overlying tray is stacked on top of the tray.

4. A multi-purpose transport tray according to claim 2 further comprising projections extending from the side portions toward the opposite side portions in the region between the shelf and the support members for positioning an object resting on the shelf.

* * * * *